United States Patent [19]

Murata et al.

[11] Patent Number: 4,732,621
[45] Date of Patent: Mar. 22, 1988

[54] METHOD FOR PRODUCING A TRANSPARENT CONDUCTIVE OXIDE LAYER AND A PHOTOVOLTAIC DEVICE INCLUDING SUCH A LAYER

[75] Inventors: Kenji Murata, Osaka; Yasuo Kishi, Hirakata, both of Japan

[73] Assignee: Sanyo Electric Co., Ltd., Moriguchi, Japan

[21] Appl. No.: 872,684

[22] Filed: Jun. 10, 1986

[30] Foreign Application Priority Data

Jun. 17, 1985 [JP] Japan .................................. 60-131284
Jun. 17, 1985 [JP] Japan .................................. 60-131285

[51] Int. Cl.$^4$ ............................................ H01L 31/06
[52] U.S. Cl. ...................................... 136/256; 136/258; 156/625; 156/647; 156/663; 357/30; 437/2; 437/181
[58] Field of Search ............... 156/625, 647, 648, 663; 136/256, 258 AM; 427/331, 337, 343; 29/572; 437/2, 181; 357/30 J, 30 K

[56] References Cited

U.S. PATENT DOCUMENTS 4,064,521 12/1977 Carlson ..................................... 357/2
4,281,208 7/1981 Kuwano et al. ..................... 136/249
4,532,537 7/1985 Kane ....................... 357/30
4,554,727 11/1985 Deckman et al. ..................... 29/572
4,599,482 7/1986 Yamazaki ............................ 136/259

FOREIGN PATENT DOCUMENTS 59-75678 4/1984 Japan ......................... 136/258 AM
175465 9/1985 Japan .

OTHER PUBLICATIONS

Extended Abstracts for the 32nd Spring Meeting of the Japan Society of Applied Physics and Related Societies (1985), 29p-U-14.

Primary Examiner—Aaron Weisstuch
Attorney, Agent, or Firm—W. G. Fasse; D. H. Kane, Jr.

[57] ABSTRACT

A method for processing a transparent conductive oxide (TCO) layer in accordance with the present invention comprises the steps of: uniformly depositing the TCO layer on a substantially flat surface of a transparent substrate; and etching the exposed surface of the TCO layer thereof to roughen the exposed surface. The so-treated TCO layer is used as a transparent electrode in photovoltaic devices and has a decreased, substantially constant reflectance throughout the visible light range.

12 Claims, 17 Drawing Figures

2tex
2c
1c

2tex

|—————|
2000Å

|———|
3300Å

METHOD FOR PRODUCING A TRANSPARENT CONDUCTIVE OXIDE LAYER AND A PHOTOVOLTAIC DEVICE INCLUDING SUCH A LAYER

BACKGROUND OF THE INVENTION

1. Field of the Invention

This invention relates to a transparent conductive oxide (TCO) layer for a light admitting electrode in a photoelectric device, and more particularly to a method for forming the TCO layer with a rough surface texture.

2. Description of the Prior Art

A layer of TCO such as indium tin oxide (ITO) or tin oxide ($SnO_x$) is used as a light admitting electrode in a photoelectric device. Particularly in an photoelectric conversion device, it is desired that the transparent front or light facing electrode admit as much light as possible to the semiconductor layer in which light energy is converted into electric energy.

A photovoltaic device which comprises a TCO front electrode, a semiconductor layer, and a back electrode stacked on a transparent insulative substrate such as a glass plate is described, for example, in U.S. Pat. Nos. 4,064,521 and 4,281,208. Generally, the TCO front electrode is formed by a vacuum evaporation method, an electron beam evaporation method, a sputtering method, a CVD method, a spray method or the like, and comprises a single layer or stacked layers of TCOs such as ITO and $SnO_x$.

Figure 1:
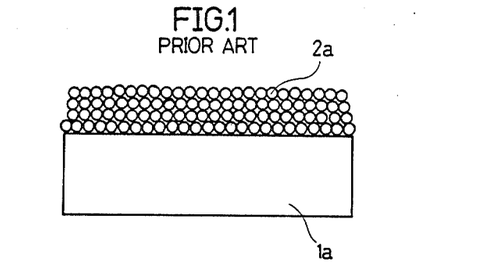
FIGS. 1 and 2 show schematic sectional views of TCO layers according to the prior art.

Referring to FIG. 1, there is shown a schematic sectional view of a TCO layer thus formed. Deposited on a glass plate 1a is a TCO layer 2a comprising aggregated small TCO particles having a mean particle size in the range of about 200–2000 Å. Accordingly, the surface of the deposited front electrode shows only a small unevenness of about 200–1000 Å in height with a periodicity of about 500–2000 Å and thus is substantially flat.

The refractive index of the TCO layer is about 2.0, while the refractive index of a semiconductor layer which is to be formed on the TCO layer is generally much larger than 2.0. For example, the index is about 4.0 for amorphous silicon derivatives such as amorphous silicon, amorphous silicon carbide, and amorphous silicon germanium. Accordingly, incoming light is partly reflected at the interface between the front electrode and semiconductor layer, and thus the quantity of light entering the semiconductor layer for photoelectric conversion is decreased.

Considering that the reflection characteristic at the interface between the front electrode and semiconductor layer is strongly influenced by the state of the interface, attempts to increase the quantity of light entering the semiconductor layer have been made by increasing the unevenness of the interface.

Firstly, an attempt to form a front electrode having a rougher surface has been made by increasing the TCO particle size. With a mean TCO particle size of about 2000–10000 Å, for example, a rough surface with an unevenness of about 1000–5000 Å in height and a periodicity of about 2000–10000 Å can be obtained. However, since such a TCO layer with a large mean particle size results in an increase in the electric resistivity, in a decrease of the light transmissibility, and in a decrease of the adhesiveness to the substrate, it is not suitable for the front electrode.

Figure 2:
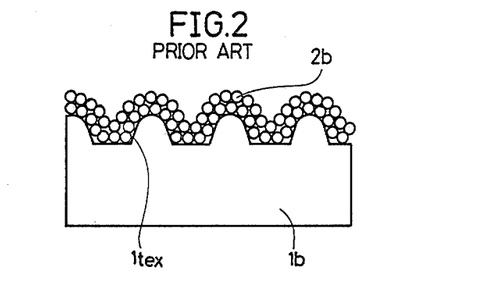

Referring to FIG. 2, there is shown a schematic sectional view of a front electrode having an uneven surface, which was recently disclosed by Hyodo et al. in the Japanese Patent Laying-Open Gazette No. 175465/1985 and in "Extended Abstracts" for the 32nd Spring Meeting of the Japan Society of Applied Physics and Related Societies, 1985, 29p-U-14. An unevenness texture 1tex is formed first on a surface of a substrate 1b, and a front electrode 2b is then formed with the usual small TCO particles on the uneven surface. Accordingly, this TCO layer 2b does not cause any increase of the resistivity, nor any decrease of the transmissibility, nor any decrease of the adhesiveness, and thus it is usable as a front electrode. However, it is difficult to process the substrate surface so that it will have an unevenness of a few thousand angstroms in height, and the process is not suitable for mass production.

SUMMARY OF THE INVENTION

It is a major object of the present invention to provide a method for forming, in a mass producible manner, a TCO layer with an uneven surface suitable for the transparent front electrode of a photoelectric device.

It is another object of the present invention to provide a mass producible photovoltaic device in which the reflection loss of incoming light at the interface between the transparent front electrode and the semiconductor layer is decreased without causing an increase of the resistivity, nor a decrease of the transmissibility, nor a decrease of the adhesiveness of the front electrode.

A method for processing a TCO layer in accordance with the present invention comprises the steps of: uniformly depositing the TCO layer on a substantially flat surface of a transparent substrate; and etching the exposed surface of the TCO layer for roughening the exposed surface.

A photovoltaic device in accordance with the present invention comprises: a transparent substrate with a flat surface; a TCO front electrode with an etched rough surface, which is formed on the flat surface of the substrate; a semiconductor layer for photoelectric conversion formed on the rough surface of the front electrode; and a back electrode formed on the semiconductor layer.

These objects and other objects, features, aspects, and advantages of the present invention will become more apparent from the following detailed description of the present invention when taken in conjunction with the accompanying drawings.

DESCRIPTION OF THE PREFERRED EMBODIMENTS

Figure 3A:
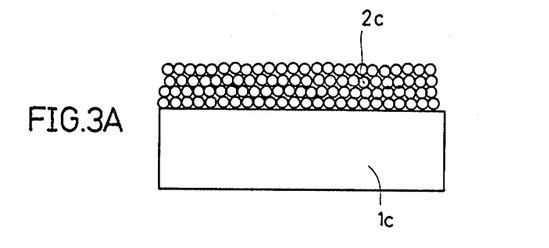
FIGS. 3A, 3B, and 3C illustrate an etching process of a TCO layer in accordance with the present invention.
Figure 3B:
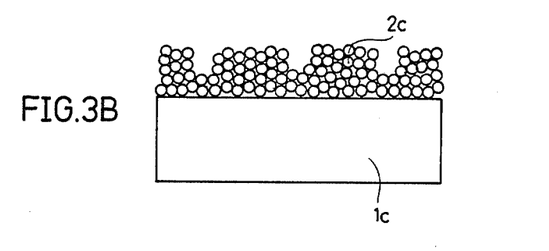
Figure 3C:
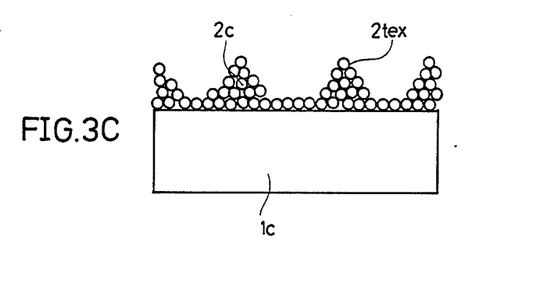

FIGS. 3A, 3B, and 3C schematically illustrate a method for processing a TCO layer in accordance with the present invention. Firstly, a TCO layer 2c is formed uniformly on a substantially flat surface of a transparent insulative substrate 1c such as a glass plate, as shown in FIG. 3A. The TCO layer 2c may be deposited by a vacuum evaporation method, an electron beam evaporation method, a sputtering method, a CVD method, a spray method or the like, and comprises ITO or $SnO_x$. More specifically, a TCO layer 2c of ITO doped with 5 wt.% $SnO_x$ may be deposited on a substrate 1c up to about 1500–7000 Å in thickness with a mean TCO particle size of about 500–2000 Å by an electron beam evaporation method under the conditions of substrate temperature of 300° C. and oxygen partial pressure of $4 \times 10^{-4}$ Torr.

In FIG. 3B, the surface of the TCO layer 2c is being etched in order to make it rough. An etchant of concentrated $HCl:H_2O:FeCl_3 = 500$ cc:600 cc:100 g is preferable for the TCO layer of ITO, and aqua regia is also usable. The etching starts and progresses dominantly at points on the TCO layer where the etching rate is higher due to the anisotropy of the etching rate, and then makes a multiplicity of small dimples on the surface of the TCO layer as shown in FIG. 3B.

FIG. 3C shows the final state of the TCO layer after the etching treatment. Namely, the etching is developed until the TCO layer has an uneven surface suitable for the front electrode, and then the etching is stopped halfway in the direction of the thickness. For example, such an uneven surface can be obtained by etching at about 25° C. for 20–40 min. with the above described etchant, and shows an unevenness of about 1000–5000 Å with a periodicity of about 2000–10000 Å.

Figure 4A:
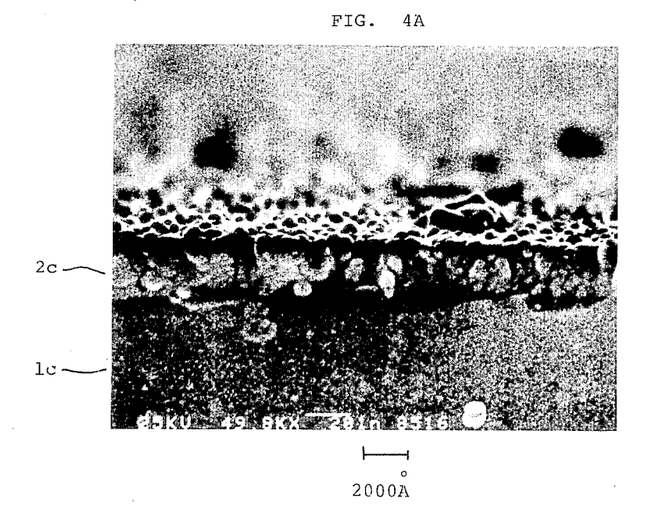
FIGS. 4A and 4B are scanning electron micrographs, respectively showing the sectional structure and the surface texture of a TCO layer in the state of FIG. 3A.
Figure 4B:
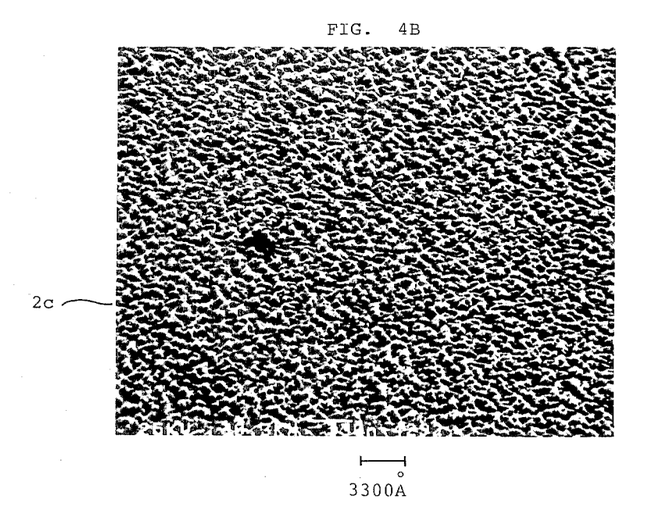

FIGS. 4A and 4B are scanning electron micrographs with scales shown thereunder, showing the particle structure of a TCO layer in the state of FIG. 3A before the etching treatment. It is noted from the scales that the magnification is different between those micrographs. FIG. 4A shows the sectional structure of the TCO layer 2c, and FIG. 4B shows the surface texture viewed from an oblique angle of 80°.

Figure 5A:
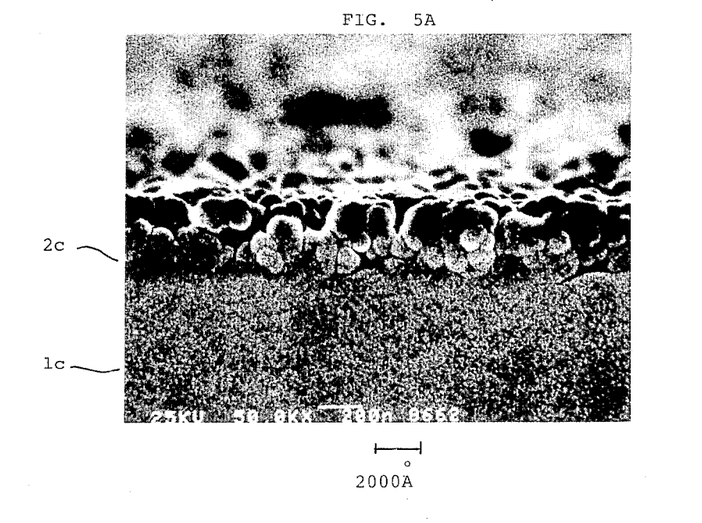
FIGS. 5A and 5B are micrographs, respectively showing the sectional structure and the surface texture of the TCO layer in the state of FIG. 3B.
Figure 5B:
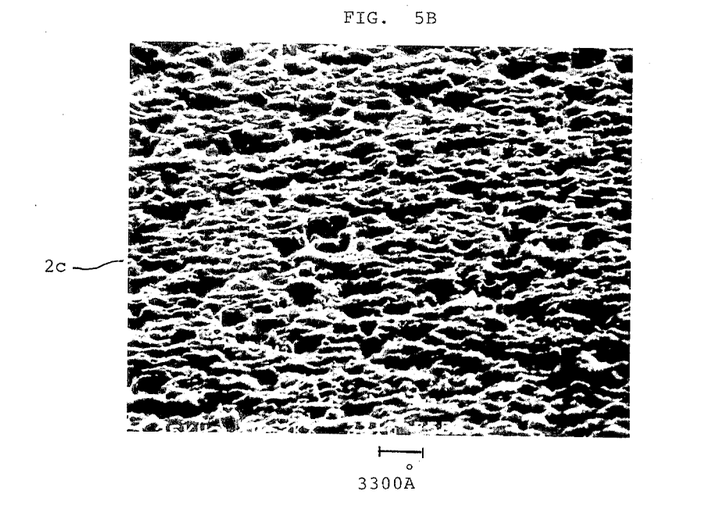

Similarly, FIGS. 5A and 5B are micrographs, respectively showing the sectional structure and the surface texture of the TCO layer 2c at such an intermediate stage of the etching treatment as in FIG. 3B.

Figure 6A:
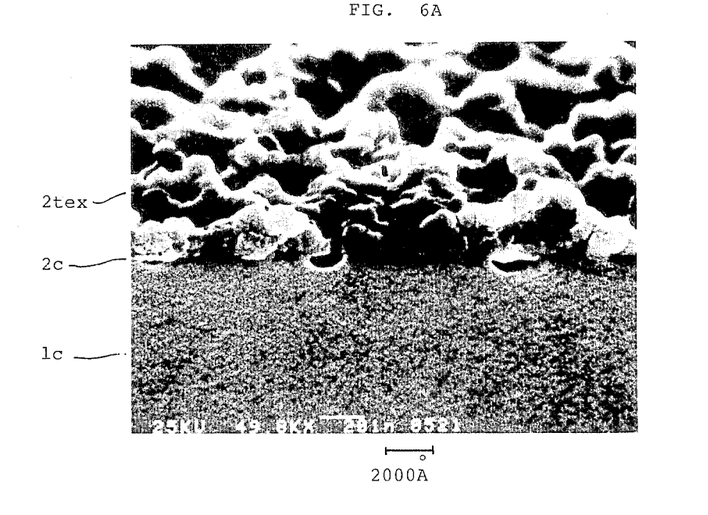
FIGS. 6A and 6B are micrographs, respectively showing the sectional structure and the surface texture of the TCO layer in the state of FIG. 3C.
Figure 6B:
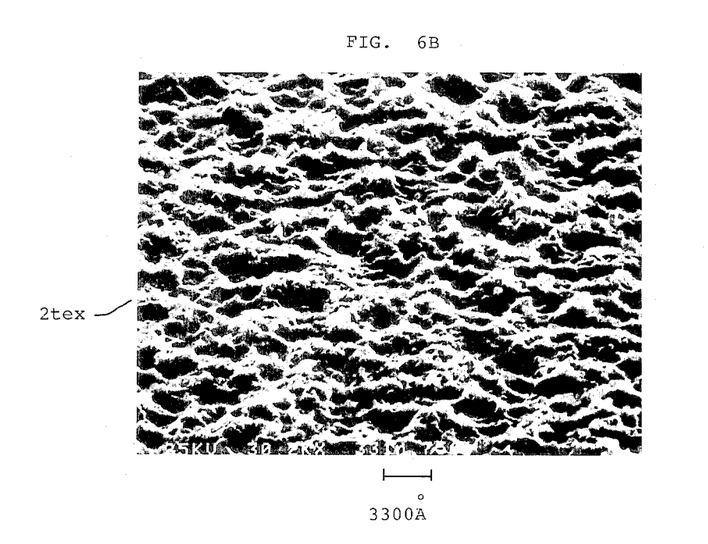

Further similarly, FIGS. 6A and 6B are micrographs, respectively showing the sectional structure and the surface texture of the TCO layer 2c in the state of FIG. 3C after the etching treatment.

It is clearly seen from these micrographs of FIG. 4A to FIG. 6B that an uneven surface 2tex of the TCO layer 2c can be readily formed due to the anisotropy of the etching rate without uniformly etching and removing the surface layer.

Figure 7A:
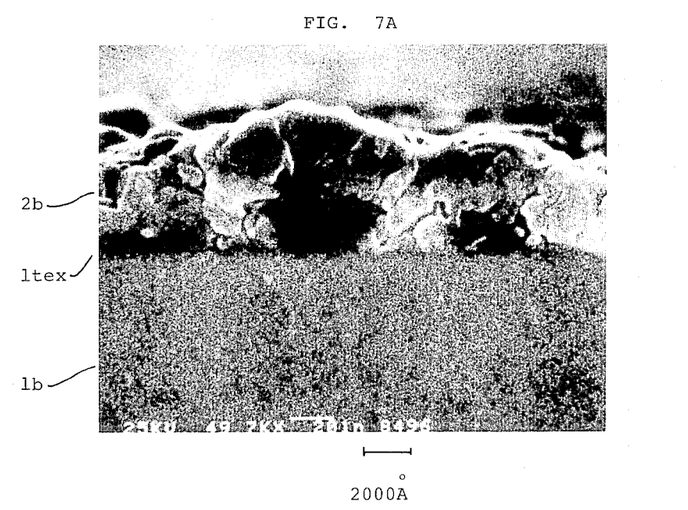
FIGS. 7A and 7B are micrographs, respectively showing the sectional structure and the surface texture of such a TCO layer as in FIG. 2.
Figure 7B:
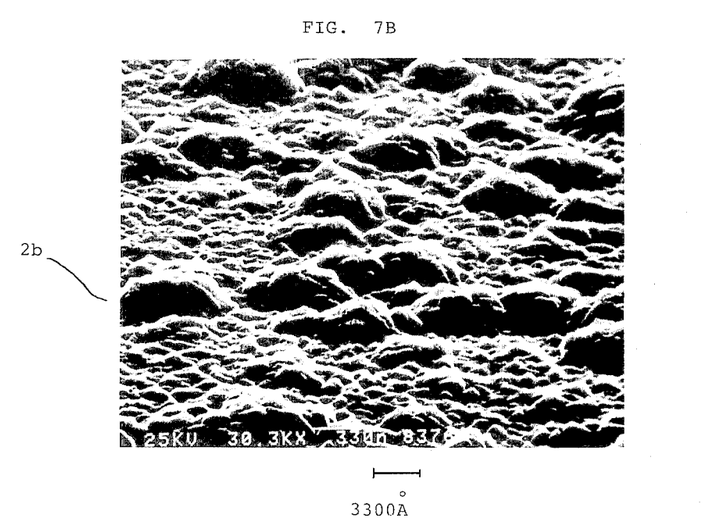

For comparison, the sectional structure and the surface texture of such a prior art TCO layer 2b as in FIG. 2 are shown in micrographs of FIGS. 7A and 7B, respectively.

Figure 8:
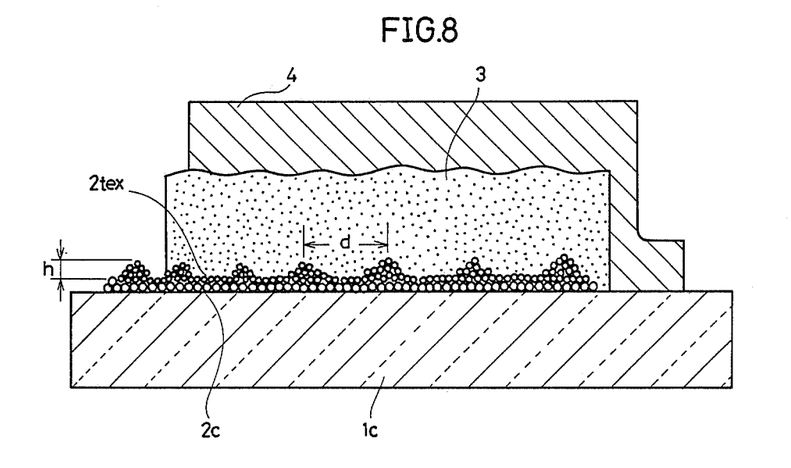
FIG. 8 is a schematic sectional view of a photovoltaic device in accordance with the present invention.

Referring to FIG. 8, there is shown a schematic sectional view of a photovoltaic device according to an embodiment of the present invention. Formed on a flat surface of a transparent insulator substrate 1c is a TCO front electrode 2c which has an uneven surface 2tex. A semiconductor layer 3 having a p-n or p-i-n junction is formed on the uneven surface 2tex of the TCO electrode 2c. For example, the semiconductor layer 3 may comprise amorphous silicon derivatives and be formed by a plasma CVD method or the like as described in U.S. Pat. No. 4,064,521. A back electrode 4 is formed on the back surface of the semiconductor layer 3. The back electrode 4 may comprise a single layer or stacked layers containing at least one layer member of aluminum (Al), silver (Ag), TCO-Ag, etc. When irradiation is admitted to the semiconductor layer 3 through the transparent substrate 1c and the TCO front electrode 2c, electric change carriers are generated in the semiconductor layer 3 and then photovoltaic electricity due to movement of these carriers is generated between the front electrode 2c and back electrode 4.

The surface of the TCO front electrode 2c in this photovoltaic device has an unevenness h of about 1000–5000 Å in height with a periodicity d of about 2000–10000 Å, regardless of the mean TCO particle size of about 500–2000 Å.

Figure 9:
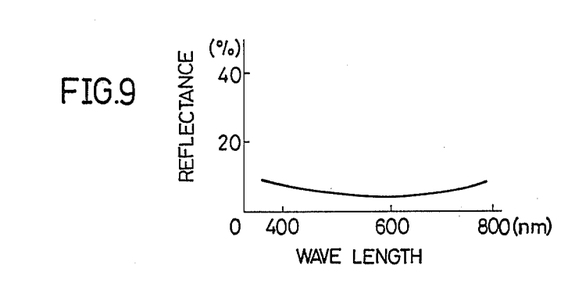
FIG. 9 is a graph showing the reflection characteristic in such a photovoltaci device as in FIG. 8.

Referring to FIG. 9, there is shown the reflection characteristic of the photovoltaic device of FIG. 8, in which the reflectance is substantially constant and less than 10% in the visible light wave length range of about 400–800 nm. This lower reflectance means that more irradiation is admitted to the semiconductor layer 3 for photoelectric conversion, and thus improves the conversion efficiency of the photovoltaic device.

Figure 10:
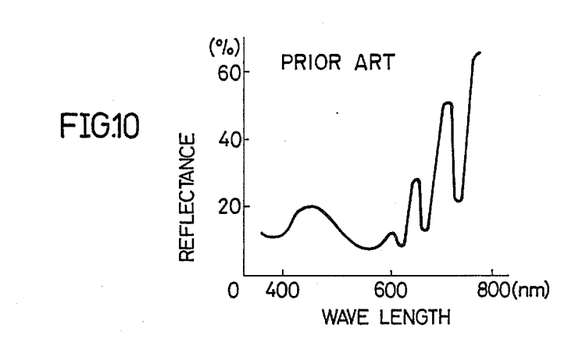
FIG. 10 is a graph showing the reflection characteristic in a conventional photovoltaic device having such a TCO layer as in FIG. 1.

For comparison, FIG. 10 shows the reflection characteristic in a conventional photovoltaic device which has the TCO layer 2a of FIG. 1 for its front electrode. The reflectance of this conventional photovoltaic device largely changes depending on the light wave length and becomes more than 20% in particular narrow ranges of the wave length.

Figure 11:
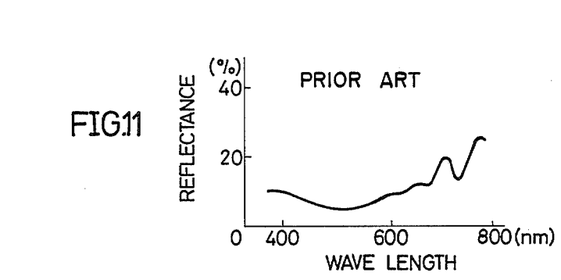
FIG. 11 is a graph showing the reflection characteristic in a prior art photovoltaic device having such a TCO layer as in FIG. 2.

Further for comparison, FIG. 11 shows the reflection characteristic in a prior art photovoltaic device which has the TCO layer 2b of FIG. 2 for its front electrode. Although the reflection characteristic shown in FIG. 11 is much improved as compared with that shown in FIG. 10, the reflectance in FIG. 11 is still rather high in the range of wave lengths longer than 600 nm. Namely, the reflection characteristic of the photovoltaic device in accordance with the present invention is further improved even as compared with that shown in FIG. 11.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing a transparent conductive oxide (TCO) layer on a transparent substrate having a substantially flat surface, comprising the following steps: uniformly depositing said TCO layer on said substantially flat surface of said transparent substrate; and chemically etching in an anisotropic manner with a chemical solution the entire exposed surface of said TCO layer for roughening said exposed surface thereby to provide a decreased, substantially constant light reflectance throughout the visible light range, wherein said exposed surface is roughened to have an unevenness of about 1000–5000 Å with a periodicity of about 2000–10,000 Å.

2. The method of claim 1, wherein said TCO layer comprises indium tin oxide.

3. The method of claim 2, wherein said TCO layer is doped with 5 wt.% $SnO_X$.

4. The method of claim 2, wherein said exposed surface is etched with an etchant of concentrated $HCl:H_2O:FeCl_3 = 500$ cc:600 cc:100 g.

5. The method of claim 2, wherein said exposed surface is etched with aqua regia.

6. The method of claim 1, wherein said TCO layer comprises aggregated TCO particles with a mean particle size of about 500–2000 Å.

7. A photovoltaic device comprising a transparent substrate with a substantially flat surface; a front electrode of a TCO layer formed on said flat surface of said substrate, said TCO layer having a chemically etched exposed surface having a roughness assuring a decreased, substantially constant reflectance throughout the visible light range, wherein said roughness of said exposed surface has an unevenness of about 1000–5000 Å with a periodicity of about 2000–10,000 Å; a semiconductor layer for photoelectric conversion formed on said exposed surface of said TCO layer; and a back electrode formed on said semiconductor layer.

8. The photovoltaic device of claim 7, wherein said TCO layer comprises indium tin oxide.

9. The photovoltaic device of claim 8, wherein said TCO layer is doped with 5 wt.% $SnO_X$.

10. The photovoltaic device of claim 8, wherein said rough surface is formed with a etchant of conc. $HCl:H_2O:FeCl_3 = 500$ cc:600 cc:100 g.

11. The photovoltaic device of claim 8, wherein said rough surface is formed with aqua regia.

12. The photovoltaic device of claim 7, wherein said TCO layer comprises aggregated TCO particles with a mean particle size of about 500–2000 Å.

* * * * *